(12) United States Patent
Lind et al.

(10) Patent No.: US 12,035,092 B2
(45) Date of Patent: Jul. 9, 2024

(54) INGRESS PROTECTION MECHANISM

(71) Applicant: GM Cruise Holdings LLC., San Francisco, CA (US)

(72) Inventors: Amanda Lind, Brooklyn, NY (US); Sally Abolitz, Pacifica, CA (US)

(73) Assignee: GM Cruise Holdings LLC, San Francisco, CA (US)

( * ) Notice: Subject to any disclaimer, the term of this patent is extended or adjusted under 35 U.S.C. 154(b) by 94 days.

(21) Appl. No.: 17/834,635

(22) Filed: Jun. 7, 2022

(65) Prior Publication Data

US 2023/0396908 A1    Dec. 7, 2023

(51) Int. Cl.
*H04R 1/08* (2006.01)
*B81B 7/00* (2006.01)
*B81C 1/00* (2006.01)
*H04R 1/04* (2006.01)
*H04R 3/00* (2006.01)
*H04R 19/04* (2006.01)

(52) U.S. Cl.
CPC .......... *H04R 1/086* (2013.01); *B81B 7/0058* (2013.01); *B81B 7/0061* (2013.01); *B81C 1/00309* (2013.01); *H04R 1/04* (2013.01); *H04R 3/00* (2013.01); *H04R 19/04* (2013.01); *B81B 2201/0257* (2013.01); *B81B 2203/0127* (2013.01); *B81C 2203/0109* (2013.01); *H04R 3/005* (2013.01); *H04R 3/007* (2013.01); *H04R 2201/003* (2013.01); *H04R 2499/13* (2013.01)

(58) Field of Classification Search
CPC . H04R 1/086; H04R 1/04; H04R 3/00; H04R 19/04; H04R 3/005; H04R 3/007; H04R 2201/003; H04R 2499/13; B81B 7/0058; B81B 7/0061; B81B 2201/0257; B81B 2203/0127; B81C 1/00309; B81C 2203/0109
See application file for complete search history.

(56) References Cited

U.S. PATENT DOCUMENTS

| | | | | |
|---|---|---|---|---|
| 11,117,798 | B2 * | 9/2021 | Lorenz | H04R 1/023 |
| 2014/0064542 | A1 * | 3/2014 | Bright | H04R 1/086 |
| | | | | 381/359 |
| 2014/0064546 | A1 * | 3/2014 | Szczech | H04R 19/04 |
| | | | | 381/361 |
| 2017/0111721 | A1 * | 4/2017 | Miehl | H04M 1/035 |
| 2018/0084340 | A1 * | 3/2018 | Clyne | H04R 1/44 |
| 2018/0102123 | A1 * | 4/2018 | Tisch | H04R 3/005 |
| 2018/0115811 | A1 * | 4/2018 | Zhang | H04R 1/086 |

* cited by examiner

*Primary Examiner* — Oyesola C Ojo
(74) *Attorney, Agent, or Firm* — Michael DiCato

(57) ABSTRACT

The disclosed technology provides solutions for preventing the ingress of potentially harmful materials, such as moisture and debris, into a sensor housing. In some aspects, an ingress-protection sub-assembly is provided. The sub-assembly can include a t-protector mounted to an outer surface of a face-plate, wherein the t-protector is disposed above an inlet in the face-plate, a printed circuit board (PCB) mounted to an inner surface of the face-plate, and a membrane disposed between the PCB and the face-plate. Methods for assembling and mounting a sub-assembly are also provided.

18 Claims, 6 Drawing Sheets

INGRESS PROTECTION MECHANISM

BACKGROUND

1. Technical Field

The disclosed technology provides solutions for protecting sensor components and in particular, provides a sub-assembly for protecting micro-electromechanical systems (MEMS), such as microphones, from moisture and debris.

2. Introduction

Autonomous vehicles (AVs) are vehicles having computers and control systems that perform driving and maintenance tasks conventionally performed by a human driver. In performance of these tasks, AVs are outfitted to collect data about the surrounding environment using a variety of vehicle-mounted sensors. Depending on the desired implementation, vehicle sensors can include, but are not limited to, microphones (or microphone arrays), Light Detection and Ranging (LiDAR) sensors, radar sensors, and/or accelerometers, etc.

BRIEF DESCRIPTION OF THE DRAWINGS

Certain features of the subject technology are set forth in the appended claims. However, the accompanying drawings, which are included to provide further understanding, illustrate disclosed aspects and together with the description serve to explain the principles of the subject technology. In the drawings:

DETAILED DESCRIPTION

Figure 1A:
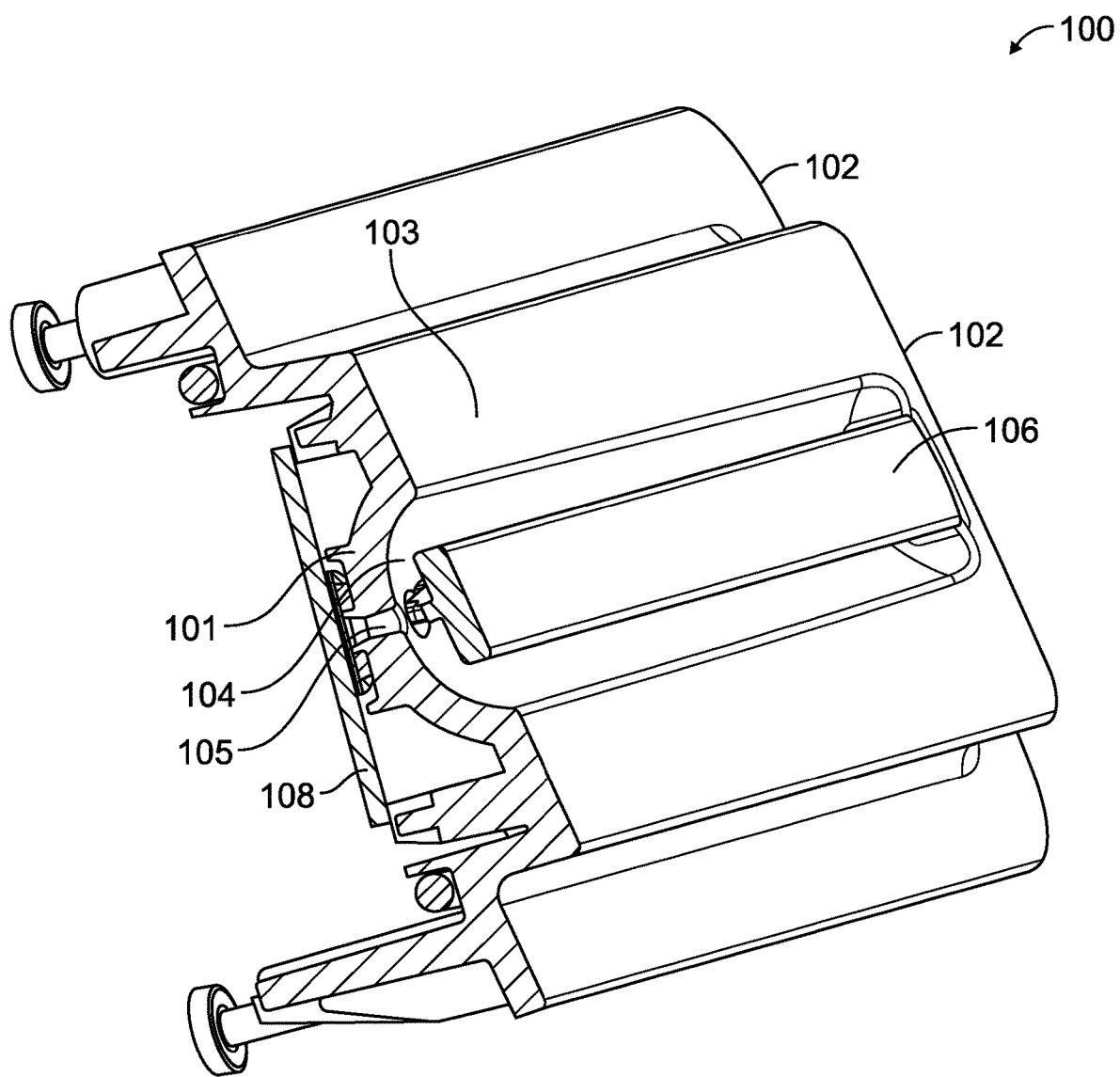
FIGS. 1A, and 1B conceptually illustrate different perspective views of an ingress-protection sub-assembly, according to some aspects of the disclosed technology.

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a more thorough understanding of the subject technology. However, it will be clear and apparent that the subject technology is not limited to the specific details set forth herein and may be practiced without these details. In some instances, structures and components are shown in block diagram form in order to avoid obscuring the concepts of the subject technology.

As described herein, one aspect of the present technology is the gathering and use of data available from various sources to improve quality and experience. The present disclosure contemplates that, in some instances, this gathered data may include personal information. The present disclosure contemplates that the entities involved with such personal information respect and value privacy policies and practices.

Sensors that are deployed to collected information about a surrounding environment, such as sensors used in autonomous vehicle (AV) applications, are often exposed to elements (e.g., as moisture, debris, dirt, and/or chemicals), that can adversely affect sensor operation. Sensor motion, such as motion due to the movement of an autonomous vehicle through an environment, can increase the speed (and force) with which moisture and other debris contacts the sensor housing, thereby exacerbating ingress of moisture or other debris into the sensor housing. Some types of sensors, such as micro-electromechanical systems (MEMS), can be particularly susceptible to malfunction due to the ingress of moisture or other debris. By way of example, the performance of microphone arrays used in some AV operations, e.g., to perform functions for localizing sound-emitting objects in the AV's environment, can be degraded in the presence of moisture or debris.

Aspects of the disclosed technology provide solutions for protecting MEMS, such as microphones in a mic array, from exposure to moisture and other debris. In some aspects, the disclosed technology includes a protective sub-assembly (or sub-assembly), that is configured block the ingress of moisture and/or debris, and to prevent contact of various materials with sensitive sensor components, such as microphones. Although several of the examples discussed herein relate to the use of a sub-assembly to preserve MEMS (such as microphones) used in vehicle applications, it is understood that the disclosed aspects are not limited to a particular application or user-case. Those of skill in the art will appreciate that the disclosed aspects may be implemented in other contexts, such as the protection of various other components deployed in other contexts, without departing from the scope of the disclosed technology.

Figure 1B:
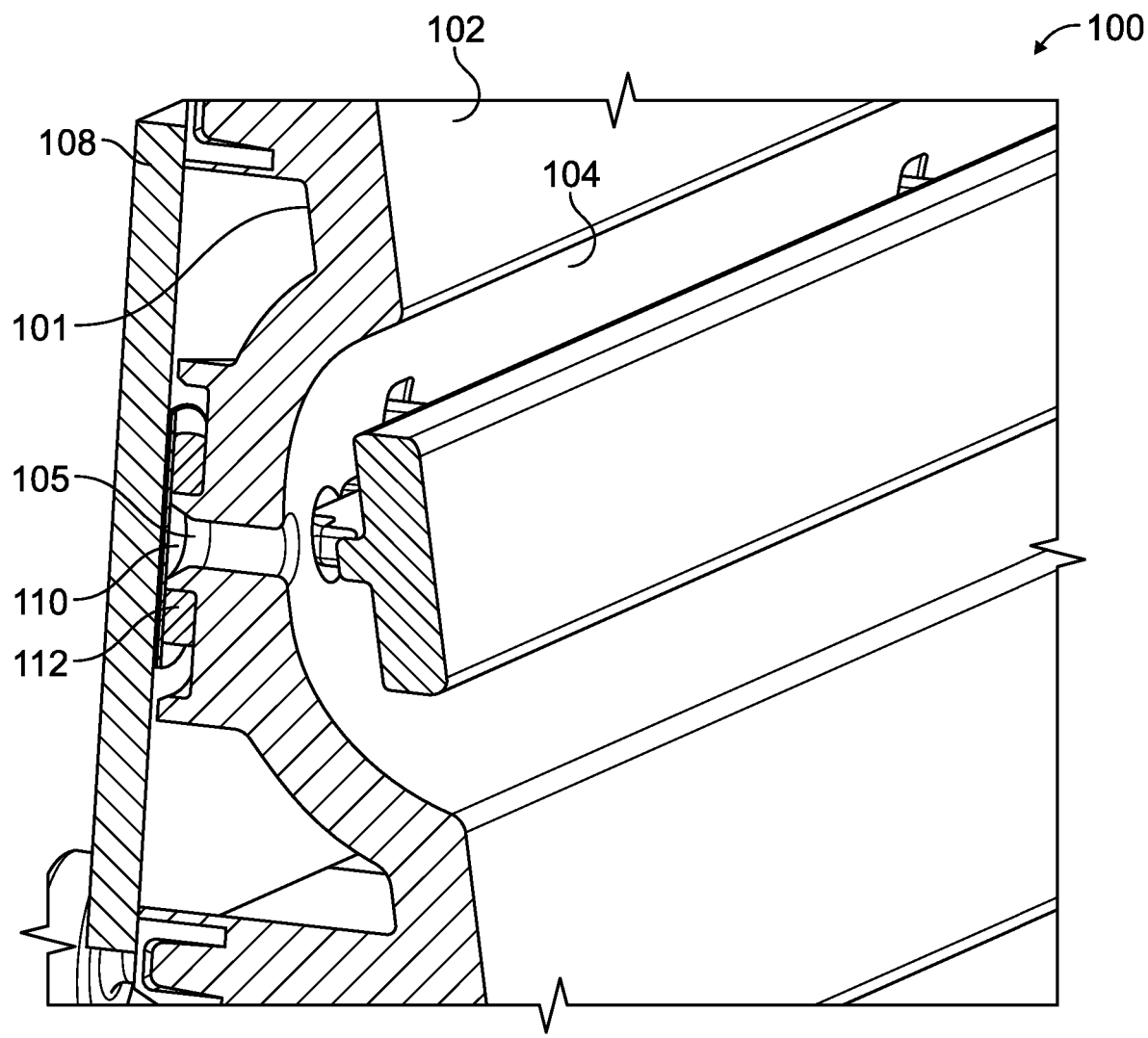

FIGS. 1A, and 1B conceptually illustrate different perspective views of an ingress-protection sub-assembly. In particular, FIG. 1A illustrates a perspective view of a sub-assembly 100 that includes a face-plate 102 mounted to a t-protector 106 (e.g., via an outer surface 103 of face-plate 102), and that is additionally mounted to a PCB 108 (e.g., via an inner surface 101 of the face plate 102). As illustrated in the example of FIG. 1, the t-protector 106 is disposed within a recess 104 in the outer surface 103 of face-plate 102, above inlet 105. In some aspects, the t-protector can be configured to reside within the recess 104 such that the t-protector is flush with at least a portion of the outer surface 103 of face-plate 102. In operation, t-protector 106 is configured to aid in preventing the ingress of air, water, and/or other debris into inlet 105, thereby preventing the further ingress of such materials into an acoustic inlet (not illustrated) in PCB 108.

FIG. 1B is a perspective view of sub-assembly 100 that illustrates an interface between face-plate 102 and PCB 108. As illustrated in FIG. 1B, inlet 105 is disposed under (or behind) t-protector 106 on an outer (or top) surface 103 of face-plate 102, e.g., within recess 104. In turn, the inner surface 101 of face-plate 102 is connected to PCB 108 and a membrane 110 is disposed between the inner surface 101 of face-plate 102 and the PCB 108. In particular, the membrane 110 can be configured to cover an acoustic port (not illustrated) in the PCB 108, e.g., that is situated adjacent to inlet 105. The membrane 110 can be affixed using a fastener, such as an adhesive. However, it is understood that membrane 110 may be affixed using different (or additional)

fasteners, without departing from the scope of the disclosed technology. Additionally, the membrane 110 can be protected from ingress by o-ring 112.

Figure 2:
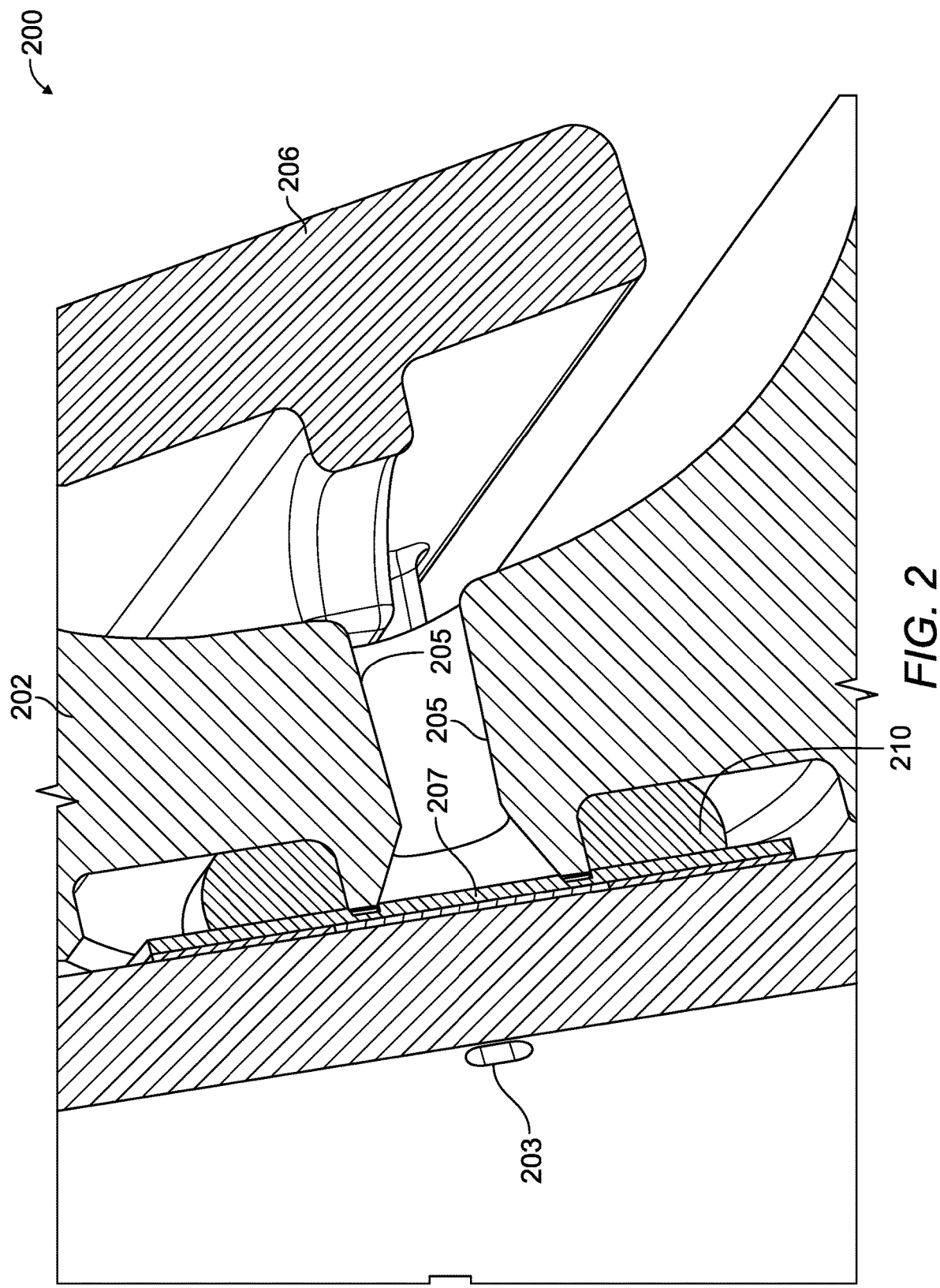
FIG. 2 illustrates a perspective view of a sub-assembly, including an alignment of an acoustic port and a face-plate inlet, according to some aspects of the disclosed technology.

FIG. 2 illustrates a perspective view of a sub-assembly 200, including an alignment of an acoustic port 203 and a face-plate inlet 205. In the illustration of FIG. 2, is shown that t-protector 206 is affixed to faceplate 202 directly above inlet 205. In turn, a membrane 207 separates inlet 205 from acoustic port 203. As discussed above, membrane 207 can be held into position (e.g., between inlet 205 and acoustic port 203) using a fastener or adhesive. Additionally, membrane 207 can be protected from ingress by an o-ring 210 positioned adjacent to membrane 207. Depending on the desired implementation, membrane 207 may be composed of different materials. For example, to resist the ingress of moisture and/or debris into acoustic port 203, membrane 207 may be comprised of a polyurethane material, e.g., that permits sound to pass from inlet 205 into acoustic port 203, without permitting the passage of moisture and/or debris.

Depending on the desired implementation and/or tolerances for coupling the t-protector 206 to the face plate 202, the inlet 205 may have a larger diameter at one side, e.g., a side that is adjacent to an opening of acoustic port 203, e.g., to facilitate alignment between the acoustic port 203 and inlet 205.

Figure 3:
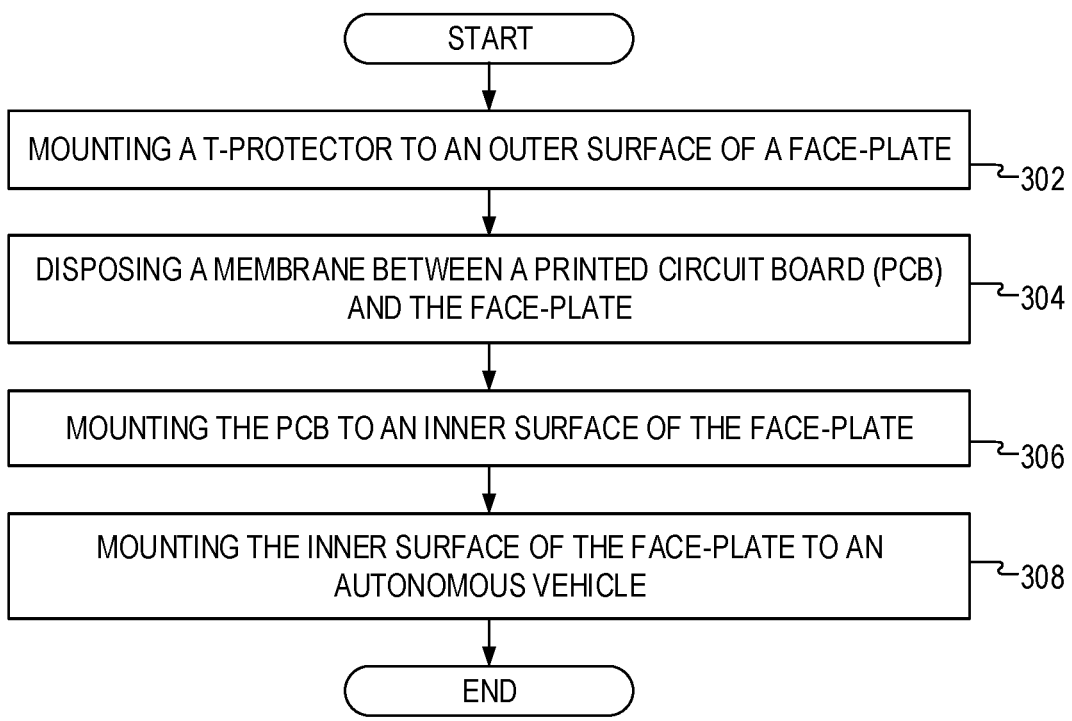
FIG. 3 illustrates a flow diagram of an example process of assembling an ingress-protection sub-assembly, according to some aspects of the disclosed technology.

FIG. 3 illustrates a flow diagram of an example process 300 of assembling an ingress-protection sub-assembly. At step 302, the process 300 includes mounting a t-protector to an outer surface of a face-plate, wherein the t-protector is disposed above an inlet in the face-plate. As discussed above, the t-protector can be configured to minimize the ingress of moisture and/or other debris into the inlet of the faceplate, thereby preventing contact of those materials with sensitive components behind the face-plate. In some approaches, the t-protector may be centered (or approximately centered) above the inlet to provide better protection from air (e.g., wind), moisture and/or other debris that can result from movement of an associated sensor assembly, e.g., that may be caused by use on a moving vehicle, such as an AV. In some aspects, the t-protector may reside within a recess (or well) that is disposed in the outer surface of the face-plate. As such, an outer or exterior surface of the t-protector may be flush with (or substantially flush with) at least a portion of the outer surface of the face plate.

At step 304, the process 300 includes disposing a membrane between a printed circuit board (PCB) and the face-plate, and wherein the membrane is configured to cover a first side of the acoustic port, wherein the PCB comprises an acoustic port, and wherein the acoustic port is configured to at least partially align with the inlet in the face-plate. As discussed above, a diameter of the inlet in the face-plate may be larger than a diameter of the acoustic port. In some aspects, the larger diameter of the inlet can help to facilitate a proper alignment with the acoustic port. Depending on the desired implementation, the diameter of the inlet, the acoustic port, and/or the ratio of the inlet diameter to the acoustic port diameter, may be differently configured depending on tolerances associated with various components. For example, if smaller tolerances are achievable when coupling the face-plate to the PCB, the diameter of the inlet may be smaller. In another example, if smaller tolerances are achievable when coupling the face-plate to the PCB, the diameter of the inlet may be closer to the diameter of the acoustic port. As discussed above with respect to FIGS. 1A, 1B and FIG. 2, the membrane can be configured to permit sound (or sound waves) to pass into an acoustic port, e.g., so that they can reach one or more MEMS (e.g., microphones) disposed on a surface of the PCB. Additionally, the membrane can be configured to resist the ingress of moisture and debris into the acoustic port. In some aspects, the membrane can be secured above the opening of the acoustic port using a gasket, such as a rubber o-ring.

At step 306, the process 300 includes mounting the PCB to an inner surface of the face-plate.

At step 308, the process 300 can also include mounting the inner surface of the face-plate to an autonomous vehicle (AV).

Figure 4:
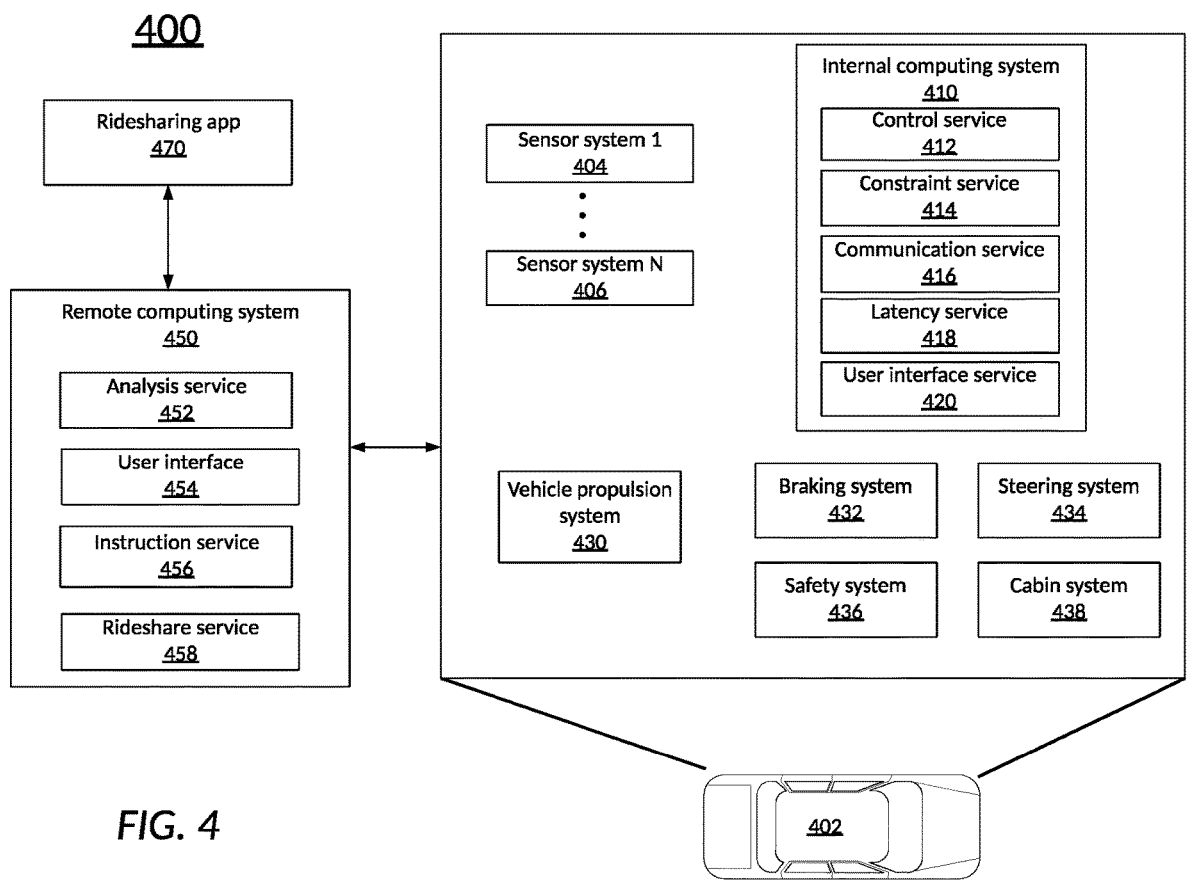
FIG. 4 illustrates an example system environment that can be used to facilitate AV dispatch and operations, according to some aspects of the disclosed technology.

Turning now to FIG. 4 illustrates an example of an AV management system 400. One of ordinary skill in the art will understand that, for the AV management system 400 and any system discussed in the present disclosure, there can be additional or fewer components in similar or alternative configurations. The illustrations and examples provided in the present disclosure are for conciseness and clarity. Other embodiments may include different numbers and/or types of elements, but one of ordinary skill the art will appreciate that such variations do not depart from the scope of the present disclosure.

In this example, the AV management system 400 includes an AV 402, a data center 450, and a client computing device 470. The AV 402, the data center 450, and the client computing device 470 can communicate with one another over one or more networks (not shown), such as a public network (e.g., the Internet, an Infrastructure as a Service (IaaS) network, a Platform as a Service (PaaS) network, a Software as a Service (SaaS) network, other Cloud Service Provider (CSP) network, etc.), a private network (e.g., a Local Area Network (LAN), a private cloud, a Virtual Private Network (VPN), etc.), and/or a hybrid network (e.g., a multi-cloud or hybrid cloud network, etc.).

AV 402 can navigate about roadways without a human driver based on sensor signals generated by multiple sensor systems 404, 406, and 408. The sensor systems 404-408 can include different types of sensors and can be arranged about the AV 402. For instance, the sensor systems 404-408 can comprise Inertial Measurement Units (IMUs), cameras (e.g., still image cameras, video cameras, etc.), light sensors (e.g., LIDAR systems, ambient light sensors, infrared sensors, etc.), RADAR systems, GPS receivers, audio sensors (e.g., microphones, Sound Navigation and Ranging (SONAR) systems, ultrasonic sensors, etc.), engine sensors, speedometers, tachometers, odometers, altimeters, tilt sensors, impact sensors, airbag sensors, seat occupancy sensors, open/closed door sensors, tire pressure sensors, rain sensors, and so forth. For example, the sensor system 404 can be a camera system, the sensor system 406 can be a LIDAR system, and the sensor system 408 can be a RADAR system. Other embodiments may include any other number and type of sensors.

AV 402 can also include several mechanical systems that can be used to maneuver or operate AV 402. For instance, the mechanical systems can include vehicle propulsion system 430, braking system 432, steering system 434, safety system 436, and cabin system 438, among other systems. Vehicle propulsion system 430 can include an electric motor, an internal combustion engine, or both. The braking system 432 can include an engine brake, brake pads, actuators, and/or any other suitable componentry configured to assist in decelerating AV 402. The steering system 434 can include suitable componentry configured to control the direction of movement of the AV 402 during navigation. Safety system 436 can include lights and signal indicators, a parking brake, airbags, and so forth. The cabin system 438 can include cabin temperature control systems, in-cabin entertainment systems, and so forth. In some embodiments, the AV 402 may not include human driver actuators (e.g., steering wheel, handbrake, foot brake pedal, foot accelerator pedal, turn signal lever, window wipers, etc.) for controlling the AV 402. Instead, the cabin system 438 can include one or more client interfaces, e.g., Graphical User Interfaces (GUIs), Voice User Interfaces (VUIs), etc., for controlling certain aspects of the mechanical systems 430-438.

AV 402 can additionally include a local computing device 410 that is in communication with the sensor systems 404-408, the mechanical systems 430-438, the data center 450, and the client computing device 470, among other systems. The local computing device 410 can include one or more processors and memory, including instructions that can be executed by the one or more processors. The instructions can make up one or more software stacks or components responsible for controlling the AV 402; communicating with the data center 450, the client computing device 470, and other systems; receiving inputs from riders, passengers, and other entities within the AV's environment; logging metrics collected by the sensor systems 404-408; and so forth. In this example, the local computing device 410 includes a perception stack 412, a mapping and localization stack 414, a planning stack 416, a control stack 418, a communications stack 420, an HD geospatial database 422, and an AV operational database 424, among other stacks and systems.

Perception stack 412 can enable the AV 402 to "see" (e.g., via cameras, LIDAR sensors, infrared sensors, etc.), "hear" (e.g., via microphones, ultrasonic sensors, RADAR, etc.), and "feel" (e.g., pressure sensors, force sensors, impact sensors, etc.) its environment using information from the sensor systems 404-408, the mapping and localization stack 414, the HD geospatial database 422, other components of the AV, and other data sources (e.g., the data center 450, the client computing device 470, third-party data sources, etc.). The perception stack 412 can detect and classify objects and determine their current and predicted locations, speeds, directions, and the like. In addition, the perception stack 412 can determine the free space around the AV 402 (e.g., to maintain a safe distance from other objects, change lanes, park the AV, etc.). The perception stack 412 can also identify environmental uncertainties, such as where to look for moving objects, flag areas that may be obscured or blocked from view, and so forth.

Mapping and localization stack 414 can determine the AV's position and orientation (pose) using different methods from multiple systems (e.g., GPS, IMUs, cameras, LIDAR, RADAR, ultrasonic sensors, the HD geospatial database 422, etc.). For example, in some embodiments, the AV 402 can compare sensor data captured in real-time by the sensor systems 404-408 to data in the HD geospatial database 422 to determine its precise (e.g., accurate to the order of a few centimeters or less) position and orientation. The AV 402 can focus its search based on sensor data from one or more first sensor systems (e.g., GPS) by matching sensor data from one or more second sensor systems (e.g., LIDAR). If the mapping and localization information from one system is unavailable, the AV 402 can use mapping and localization information from a redundant system and/or from remote data sources.

The planning stack 416 can determine how to maneuver or operate the AV 402 safely and efficiently in its environment. For example, the planning stack 416 can receive the location, speed, and direction of the AV 402, geospatial data, data regarding objects sharing the road with the AV 402 (e.g., pedestrians, bicycles, vehicles, ambulances, buses, cable cars, trains, traffic lights, lanes, road markings, etc.) or certain events occurring during a trip (e.g., emergency vehicle blaring a siren, intersections, occluded areas, street closures for construction or street repairs, double-parked cars, etc.), traffic rules and other safety standards or practices for the road, user input, and other relevant data for directing the AV 402 from one point to another. The planning stack 416 can determine multiple sets of one or more mechanical operations that the AV 402 can perform (e.g., go straight at a specified rate of acceleration, including maintaining the same speed or decelerating; turn on the left blinker, decelerate if the AV is above a threshold range for turning, and turn left; turn on the right blinker, accelerate if the AV is stopped or below the threshold range for turning, and turn right; decelerate until completely stopped and reverse; etc.), and select the best one to meet changing road conditions and events. If something unexpected happens, the planning stack 416 can select from multiple backup plans to carry out. For example, while preparing to change lanes to turn right at an intersection, another vehicle may aggressively cut into the destination lane, making the lane change unsafe. The planning stack 416 could have already determined an alternative plan for such an event, and upon its occurrence, help to direct the AV 402 to go around the block instead of blocking a current lane while waiting for an opening to change lanes.

The control stack 418 can manage the operation of the vehicle propulsion system 430, the braking system 432, the steering system 434, the safety system 436, and the cabin system 438. The control stack 418 can receive sensor signals from the sensor systems 404-408 as well as communicate with other stacks or components of the local computing device 410 or a remote system (e.g., the data center 450) to effectuate operation of the AV 402. For example, the control stack 418 can implement the final path or actions from the multiple paths or actions provided by the planning stack 416. This can involve turning the routes and decisions from the planning stack 416 into commands for the actuators that control the AV's steering, throttle, brake, and drive unit.

The communication stack 420 can transmit and receive signals between the various stacks and other components of the AV 402 and between the AV 402, the data center 450, the client computing device 470, and other remote systems. The communication stack 420 can enable the local computing device 410 to exchange information remotely over a network, such as through an antenna array or interface that can provide a metropolitan WIFI network connection, a mobile or cellular network connection (e.g., Third Generation (3G), Fourth Generation (4G), Long-Term Evolution (LTE), 5th Generation (5G), etc.), and/or other wireless network connection (e.g., License Assisted Access (LAA), Citizens Broadband Radio Service (CBRS), MULTEFIRE, etc.). The communication stack 420 can also facilitate local exchange of information, such as through a wired connection (e.g., a user's mobile computing device docked in an in-car docking station or connected via Universal Serial Bus (USB), etc.) or a local wireless connection (e.g., Wireless Local Area Network (WLAN), Bluetooth®, infrared, etc.).

The HD geospatial database 422 can store HD maps and related data of the streets upon which the AV 402 travels. In some embodiments, the HD maps and related data can comprise multiple layers, such as an areas layer, a lanes and boundaries layer, an intersections layer, a traffic controls layer, and so forth. The areas layer can include geospatial information indicating geographic areas that are drivable (e.g., roads, parking areas, shoulders, etc.) or not drivable (e.g., medians, sidewalks, buildings, etc.), drivable areas that constitute links or connections (e.g., drivable areas that form the same road) versus intersections (e.g., drivable areas where two or more roads intersect), and so on. The lanes and boundaries layer can include geospatial information of road lanes (e.g., lane centerline, lane boundaries, type of lane boundaries, etc.) and related attributes (e.g., direction of travel, speed limit, lane type, etc.). The lanes and boundaries layer can also include 3D attributes related to lanes (e.g., slope, elevation, curvature, etc.). The intersections layer can include geospatial information of intersections (e.g., crosswalks, stop lines, turning lane centerlines and/or boundaries, etc.) and related attributes (e.g., permissive, protected/permissive, or protected only left turn lanes; legal or illegal U-turn lanes; permissive or protected only right turn lanes; etc.). The traffic controls lane can include geospatial information of traffic signal lights, traffic signs, and other road objects and related attributes.

The AV operational database 424 can store raw AV data generated by the sensor systems 404-408 and other components of the AV 402 and/or data received by the AV 402 from remote systems (e.g., the data center 450, the client computing device 470, etc.). In some embodiments, the raw AV data can include HD LIDAR point cloud data, image data, RADAR data, GPS data, and other sensor data that the data center 450 can use for creating or updating AV geospatial data as discussed further below with respect to FIG. 2 and elsewhere in the present disclosure.

The data center 450 can be a private cloud (e.g., an enterprise network, a co-location provider network, etc.), a public cloud (e.g., an Infrastructure as a Service (IaaS) network, a Platform as a Service (PaaS) network, a Software as a Service (SaaS) network, or other Cloud Service Provider (CSP) network), a hybrid cloud, a multi-cloud, and so forth. The data center 450 can include one or more computing devices remote to the local computing device 410 for managing a fleet of AVs and AV-related services. For example, in addition to managing the AV 402, the data center 450 may also support a ridesharing service, a delivery service, a remote/roadside assistance service, street services (e.g., street mapping, street patrol, street cleaning, street metering, parking reservation, etc.), and the like.

The data center 450 can send and receive various signals to and from the AV 402 and client computing device 470. These signals can include sensor data captured by the sensor systems 404-408, roadside assistance requests, software updates, ridesharing pick-up and drop-off instructions, and so forth. In this example, the data center 450 includes a data management platform 452, an Artificial Intelligence/Machine Learning (AI/ML) platform 454, a simulation platform 456, a remote assistance platform 458, a ridesharing platform 460, and map management system platform 462, among other systems.

Data management platform 452 can be a "big data" system capable of receiving and transmitting data at high velocities (e.g., near real-time or real-time), processing a large variety of data, and storing large volumes of data (e.g., terabytes, petabytes, or more of data). The varieties of data can include data having different structure (e.g., structured, semi-structured, unstructured, etc.), data of different types (e.g., sensor data, mechanical system data, ridesharing service, map data, audio, video, etc.), data associated with different types of data stores (e.g., relational databases, key-value stores, document databases, graph databases, column-family databases, data analytic stores, search engine databases, time series databases, object stores, file systems, etc.), data originating from different sources (e.g., AVs, enterprise systems, social networks, etc.), data having different rates of change (e.g., batch, streaming, etc.), or data having other heterogeneous characteristics. The various platforms and systems of the data center 450 can access data stored by the data management platform 452 to provide their respective services.

The AI/ML platform 454 can provide the infrastructure for training and evaluating machine learning algorithms for operating the AV 402, the simulation platform 456, the remote assistance platform 458, the ridesharing platform 460, the map management system platform 462, and other platforms and systems. Using the AI/ML platform 454, data scientists can prepare data sets from the data management platform 452; select, design, and train machine learning models; evaluate, refine, and deploy the models; maintain, monitor, and retrain the models; and so on.

The simulation platform 456 can enable testing and validation of the algorithms, machine learning models, neural networks, and other development efforts for the AV 402, the remote assistance platform 458, the ridesharing platform 460, the map management system platform 462, and other platforms and systems. The simulation platform 456 can replicate a variety of driving environments and/or reproduce real-world scenarios from data captured by the AV 402, including rendering geospatial information and road infrastructure (e.g., streets, lanes, crosswalks, traffic lights, stop signs, etc.) obtained from the map management system platform 462; modeling the behavior of other vehicles, bicycles, pedestrians, and other dynamic elements; simulating inclement weather conditions, different traffic scenarios; and so on.

The remote assistance platform 458 can generate and transmit instructions regarding the operation of the AV 402. For example, in response to an output of the AI/ML platform 454 or other system of the data center 450, the remote assistance platform 458 can prepare instructions for one or more stacks or other components of the AV 402.

The ridesharing platform 460 can interact with a customer of a ridesharing service via a ridesharing application 472 executing on the client computing device 470. The client computing device 470 can be any type of computing system, including a server, desktop computer, laptop, tablet, smartphone, smart wearable device (e.g., smart watch, smart eyeglasses or other Head-Mounted Display (HMD), smart ear pods or other smart in-ear, on-ear, or over-ear device, etc.), gaming system, or other general purpose computing device for accessing the ridesharing application 472. The client computing device 470 can be a customer's mobile computing device or a computing device integrated with the AV 402 (e.g., the local computing device 410). The ridesharing platform 460 can receive requests to be picked up or dropped off from the ridesharing application 472 and dispatch the AV 402 for the trip.

Map management system platform 462 can provide a set of tools for the manipulation and management of geographic and spatial (geospatial) and related attribute data. The data management platform 452 can receive LIDAR point cloud data, image data (e.g., still image, video, etc.), RADAR data, GPS data, and other sensor data (e.g., raw data) from one or more AVs 402, UAVs, satellites, third-party mapping services, and other sources of geospatially referenced data. The raw data can be processed, and map management system platform 462 can render base representations (e.g., tiles (2D), bounding volumes (3D), etc.) of the AV geospatial data to enable users to view, query, label, edit, and otherwise interact with the data. Map management system platform 462 can manage workflows and tasks for operating on the AV geospatial data. Map management system platform 462 can control access to the AV geospatial data, including granting or limiting access to the AV geospatial data based on user-based, role-based, group-based, task-based, and other attribute-based access control mechanisms. Map management system platform 462 can provide version control for the AV geospatial data, such as to track specific changes that (human or machine) map editors have made to the data and to revert changes when necessary. Map management system platform 462 can administer release management of the AV geospatial data, including distributing suitable iterations of the data to different users, computing devices, AVs, and other consumers of HD maps. Map management system platform 462 can provide analytics regarding the AV geospatial data and related data, such as to generate insights relating to the throughput and quality of mapping tasks.

In some embodiments, the map viewing services of map management system platform 462 can be modularized and deployed as part of one or more of the platforms and systems of the data center 450. For example, the AI/ML platform 454 may incorporate the map viewing services for visualizing the effectiveness of various object detection or object classification models, the simulation platform 456 may incorporate the map viewing services for recreating and visualizing certain driving scenarios, the remote assistance platform 458 may incorporate the map viewing services for replaying traffic incidents to facilitate and coordinate aid, the ridesharing platform 460 may incorporate the map viewing services into the client application 472 to enable passengers to view the AV 402 in transit en route to a pick-up or drop-off location, and so on.

Figure 5:
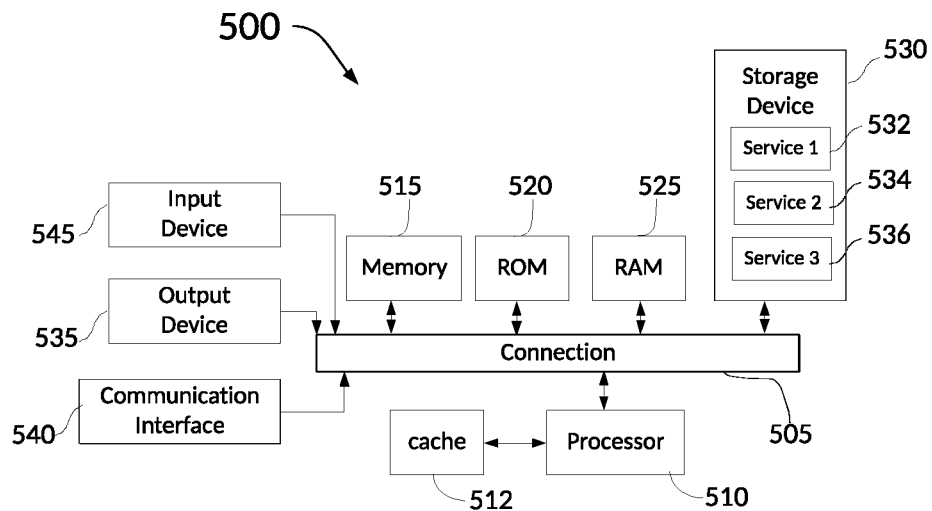
FIG. 5 illustrates an example processor-based system with which some aspects of the subject technology can be implemented.

FIG. 5 illustrates an example processor-based system with which some aspects of the subject technology can be implemented. For example, processor-based system 500 can be any computing device making up local computing device 410, remote computing system 450, a passenger device executing the rideshare app 472, or any component thereof in which the components of the system are in communication with each other using connection 505. Connection 505 can be a physical connection via a bus, or a direct connection into processor 510, such as in a chipset architecture. Connection 505 can also be a virtual connection, networked connection, or logical connection.

In some embodiments, computing system 500 is a distributed system in which the functions described in this disclosure can be distributed within a datacenter, multiple data centers, a peer network, etc. In some embodiments, one or more of the described system components represents many such components each performing some or all of the function for which the component is described. In some embodiments, the components can be physical or virtual devices.

Example system 500 includes at least one processing unit (CPU or processor) 510 and connection 505 that couples various system components including system memory 515, such as read-only memory (ROM) 520 and random-access memory (RAM) 525 to processor 510. Computing system 500 can include a cache of high-speed memory 512 connected directly with, in close proximity to, or integrated as part of processor 510.

Processor 510 can include any general-purpose processor and a hardware service or software service, such as services 532, 534, and 536 stored in storage device 530, configured to control processor 510 as well as a special-purpose processor where software instructions are incorporated into the actual processor design. Processor 510 may essentially be a completely self-contained computing system, containing multiple cores or processors, a bus, memory controller, cache, etc. A multi-core processor may be symmetric or asymmetric.

To enable user interaction, computing system 500 includes an input device 545, which can represent any number of input mechanisms, such as a microphone for speech, a touch-sensitive screen for gesture or graphical input, keyboard, mouse, motion input, speech, etc. Computing system 500 can also include output device 535, which can be one or more of a number of output mechanisms known to those of skill in the art. In some instances, multimodal systems can enable a user to provide multiple types of input/output to communicate with computing system 500. Computing system 500 can include communications interface 540, which can generally govern and manage the user input and system output. The communication interface may perform or facilitate receipt and/or transmission wired or wireless communications via wired and/or wireless transceivers, including those making use of an audio jack/plug, a microphone jack/plug, a universal serial bus (USB) port/plug, an Apple® Lightning® port/plug, an Ethernet port/plug, a fiber optic port/plug, a proprietary wired port/plug, a BLUETOOTH® wireless signal transfer, a BLUETOOTH® low energy (BLE) wireless signal transfer, an IBEACON® wireless signal transfer, a radio-frequency identification (RFID) wireless signal transfer, near-field communications (NFC) wireless signal transfer, dedicated short range communication (DSRC) wireless signal transfer, 802.11 Wi-Fi wireless signal transfer, wireless local area network (WLAN) signal transfer, Visible Light Communication (VLC), Worldwide Interoperability for Microwave Access (WiMAX), Infrared (IR) communication wireless signal transfer, Public Switched Telephone Network (PSTN) signal transfer, Integrated Services Digital Network (ISDN) signal transfer, 3G/4G/5G/LTE cellular data network wireless signal transfer, ad-hoc network signal transfer, radio wave signal transfer, microwave signal transfer, infrared signal transfer, visible light signal transfer, ultraviolet light signal transfer, wireless signal transfer along the electromagnetic spectrum, or some combination thereof.

Communication interface 540 may also include one or more Global Navigation Satellite System (GNSS) receivers or transceivers that are used to determine a location of the computing system 500 based on receipt of one or more signals from one or more satellites associated with one or more GNSS systems. GNSS systems include, but are not limited to, the US-based Global Positioning System (GPS), the Russia-based Global Navigation Satellite System (GLONASS), the China-based BeiDou Navigation Satellite System (BDS), and the Europe-based Galileo GNSS. There is no restriction on operating on any particular hardware arrangement, and therefore the basic features here may easily be substituted for improved hardware or firmware arrangements as they are developed.

Storage device 530 can be a non-volatile and/or non-transitory and/or computer-readable memory device and can be a hard disk or other types of computer readable media which can store data that are accessible by a computer, such as magnetic cassettes, flash memory cards, solid state memory devices, digital versatile disks, cartridges, a floppy disk, a flexible disk, a hard disk, magnetic tape, a magnetic strip/stripe, any other magnetic storage medium, flash memory, memristor memory, any other solid-state memory, a compact disc read only memory (CD-ROM) optical disc, a rewritable compact disc (CD) optical disc, digital video disk (DVD) optical disc, a blu-ray disc (BDD) optical disc, a holographic optical disk, another optical medium, a secure digital (SD) card, a micro secure digital (microSD) card, a Memory Stick® card, a smartcard chip, a EMV chip, a subscriber identity module (SIM) card, a mini/micro/nano/ pico SIM card, another integrated circuit (IC) chip/card, random access memory (RAM), static RAM (SRAM), dynamic RAM (DRAM), read-only memory (ROM), programmable read-only memory (PROM), erasable programmable read-only memory (EPROM), electrically erasable programmable read-only memory (EEPROM), flash EPROM (FLASHEPROM), cache memory (L1/L2/L3/L4/L5/L#), resistive random-access memory (RRAM/ReRAM), phase change memory (PCM), spin transfer torque RAM (STT-RAM), another memory chip or cartridge, and/or a combination thereof.

Storage device 530 can include software services, servers, services, etc., that when the code that defines such software is executed by the processor 510, it causes the system to perform a function. In some embodiments, a hardware service that performs a particular function can include the software component stored in a computer-readable medium in connection with the necessary hardware components, such as processor 510, connection 505, output device 535, etc., to carry out the function.

As understood by those of skill in the art, machine-learning based techniques can vary depending on the desired implementation. For example, machine-learning classification schemes can utilize one or more of the following, alone or in combination: Ensemble of Regression Trees, hidden Markov models; recurrent neural networks; convolutional neural networks (CNNs); deep learning; Bayesian symbolic methods; general adversarial networks (GANs); support vector machines; image registration methods; applicable rule-based system. Where regression algorithms are used, they may include including but are not limited to: a Stochastic Gradient Descent Regressor, and/or a Passive Aggressive Regressor, etc.

Machine learning models can also be based on clustering algorithms (e.g., a Mini-batch K-means clustering algorithm), a recommendation algorithm (e.g., a Miniwise Hashing algorithm, or Euclidean Locality-Sensitive Hashing (LSH) algorithm), and/or an anomaly detection algorithm, such as a Local outlier factor. Additionally, machine-learning models can employ a dimensionality reduction approach, such as, one or more of: a Mini-batch Dictionary Learning algorithm, an Incremental Principal Component Analysis (PCA) algorithm, a Latent Dirichlet Allocation algorithm, and/or a Mini-batch K-means algorithm, etc.

Embodiments within the scope of the present disclosure may also include tangible and/or non-transitory computer-readable storage media or devices for carrying or having computer-executable instructions or data structures stored thereon. Such tangible computer-readable storage devices can be any available device that can be accessed by a general purpose or special purpose computer, including the functional design of any special purpose processor as described above. By way of example, and not limitation, such tangible computer-readable devices can include RAM, ROM, EEPROM, CD-ROM or other optical disk storage, magnetic disk storage or other magnetic storage devices, or any other device which can be used to carry or store desired program code in the form of computer-executable instructions, data structures, or processor chip design. When information or instructions are provided via a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable storage devices.

Computer-executable instructions include, for example, instructions and data which cause a general-purpose computer, special purpose computer, or special purpose processing device to perform a certain function or group of functions. Computer-executable instructions also include program modules that are executed by computers in stand-alone or network environments. Generally, program modules include routines, programs, components, data structures, objects, and the functions inherent in the design of special-purpose processors, etc. that perform tasks or implement abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Other embodiments of the disclosure may be practiced in network computing environments with many types of computer system configurations, including personal computers, hand-held devices, multi-processor systems, microprocessor-based or programmable consumer electronics, network PCs, minicomputers, mainframe computers, and the like. Embodiments may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

The various embodiments described above are provided by way of illustration only and should not be construed to limit the scope of the disclosure. For example, the principles herein apply equally to optimization as well as general improvements. Various modifications and changes may be made to the principles described herein without following the example embodiments and applications illustrated and described herein, and without departing from the spirit and scope of the disclosure. Claim language reciting "at least one of" a set indicates that one member of the set or multiple members of the set satisfy the claim.

What is claimed is:

1. A sub-assembly, comprising:
   a t-protector mounted to an outer surface of a face-plate, wherein the t-protector is disposed above an inlet in the face-plate;
   a printed circuit board (PCB) mounted to an inner surface of the face-plate, wherein the PCB comprises an acoustic port, and wherein the acoustic port is configured to at least partially align with the inlet in the face-plate; and
   a membrane disposed between the PCB and the face-plate, and wherein the membrane is configured to cover a first side of the acoustic port,
   wherein at least one micro-electromechanical system (MEMS) is affixed to the PCB, and
   wherein the at least one MEMS is disposed above a second side of the acoustic port.

2. The sub-assembly of claim 1, wherein the membrane is affixed over the first side of the acoustic port and protected from ingress of debris by an o-ring positioned adjacent to the membrane.

3. The sub-assembly of claim 1, wherein the at least one MEMS is a microphone.

4. The sub-assembly of claim 1, wherein the t-protector is mounted within a recess in the outer surface of the face-plate.

5. The sub-assembly of claim 1, wherein the acoustic port has a smaller diameter than the inlet.

6. The sub-assembly of claim 1, wherein the t-protector is configured to be substantially flush with the outer surface of the face-plate.

7. The sub-assembly of claim 1, wherein the membrane is configured to prevent an ingress of moisture into the acoustic port of the PCB.

8. The sub-assembly of claim 1, wherein the membrane is configured to prevent an ingress of debris into the acoustic port of the PCB.

9. The sub-assembly of claim 1, wherein the membrane is configured to permit transmission of sound waves into the acoustic port.

10. A method of assembling an ingress-prevention sub-assembly, comprising:
   mounting a t-protector to an outer surface of a face-plate, wherein the t-protector is disposed above an inlet in the face-plate;
   disposing a membrane between a printed circuit board (PCB) and the face-plate, and wherein the membrane is configured to cover a first side of an acoustic port, wherein the PCB comprises an acoustic port, and wherein the acoustic port is configured to at least partially align with the inlet in the face-plate; and
   mounting the PCB to an inner surface of the face-plate, wherein at least one micro-electromechanical system (MEMS) is affixed to the PCB, and
   wherein the at least one MEMS is disposed above a second side of the acoustic port.

11. The method of claim 10, wherein the membrane is affixed over the first side of the acoustic port and protected by an o-ring positioned adjacent to the membrane.

12. The method of claim 10, wherein the at least one MEMS is a microphone.

13. The method of claim 10, wherein the t-protector is mounted within a recess in the outer surface of the face-plate.

14. The method of claim 10, wherein the acoustic port has a smaller diameter than the inlet.

15. The method of claim 10, wherein the t-protector is configured to be substantially flush with the outer surface of the face-plate.

16. The method of claim 10, wherein the membrane is configured to prevent an ingress of moisture into the acoustic port of the PCB.

17. The method of claim 10, wherein the membrane is configured to prevent an ingress of debris into the acoustic port of the PCB.

18. A method of assembling an ingress-prevention sub-assembly, comprising:
   mounting a t-protector to an outer surface of a face-plate, wherein the t-protector is disposed above an inlet in the face-plate;
   disposing a membrane between a printed circuit board (PCB) and the face-plate, and wherein the membrane is configured to cover a first side of an acoustic port, wherein the PCB comprises the acoustic port, and wherein the acoustic port is configured to at least partially align with the inlet in the face-plate;
   mounting the PCB to an inner surface of the face-plate; and
   mounting an inner surface of the face-plate to an autonomous vehicle (AV),
   wherein at least one micro-electromechanical system (MEMS) is affixed to the PCB, and
   wherein the at least one MEMS is disposed above a second side of the acoustic port.

* * * * *